(12) United States Patent
Singh et al.

(10) Patent No.: US 6,985,211 B2
(45) Date of Patent: Jan. 10, 2006

(54) LITHOGRAPHIC APPARATUS, DEVICE MANUFACTURING METHODS, DEVICES MANUFACTURED THEREBY, METHOD OF MANUFACTURING A REFLECTOR, REFLECTOR MANUFACTURED THEREBY AND PHASE SHIFT MASK

(75) Inventors: Mandeep Singh, Twickenham (GB); Josephus Johannes Maria Braat, Delft (NL)

(73) Assignee: ASML Netherlands B.V., Veldhoven (NL)

(*) Notice: Subject to any disclaimer, the term of this patent is extended or adjusted under 35 U.S.C. 154(b) by 16 days.

(21) Appl. No.: 10/896,020

(22) Filed: Jul. 22, 2004

(65) Prior Publication Data

US 2004/0263820 A1 Dec. 30, 2004

Related U.S. Application Data

(63) Continuation of application No. 10/147,309, filed on May 17, 2002, now Pat. No. 6,777,140.

(30) Foreign Application Priority Data

May 21, 2001 (EP) ............................................ 01304452

(51) Int. Cl.
*G03B 27/72* (2006.01)
*G03B 27/54* (2006.01)
*G03B 9/00* (2006.01)

(52) U.S. Cl. ................................ 355/69; 355/67; 430/5

(58) Field of Classification Search .................. 355/53, 355/60, 67, 69; 430/5, 22, 30

See application file for complete search history.

(56) References Cited

U.S. PATENT DOCUMENTS

| 5,272,744 | A | 12/1993 | Itou et al. |
| 5,338,647 | A | 8/1994 | Nakagawa et al. |
| 5,399,448 | A | 3/1995 | Nagata et al. |
| 6,159,643 | A | 12/2000 | Levinson et al. |
| 6,333,961 | B1 * | 12/2001 | Murakami ............... 378/35 |
| 6,479,195 | B1 * | 11/2002 | Kirchauer et al. ........ 430/5 |
| 6,562,522 | B1 | 5/2003 | Yan |

FOREIGN PATENT DOCUMENTS

| EP | 0 708 367 A1 | 4/1996 |
| EP | 1 152 435 A1 | 11/2001 |
| JP | 11-305417 | 11/1999 |

OTHER PUBLICATIONS

European Search Report for Application No. 01 30 4452.4, dated Nov. 29, 2001.

XP–002183158, neha Choksi et al., "Maskless Extreme Ultraviolet Lithography," J. Vac. Sci. Technol. B 17(6), Nov./Dec. 1999, pp. 3047–3051.

* cited by examiner

*Primary Examiner*—Henry Hung Nguyen
(74) *Attorney, Agent, or Firm*—Pillsbury Winthrop Shaw Pittman LLP (57) ABSTRACT

A reflector for EUV has additional multi-layers on the front surface of a base multilayer stack provided selectively to compensate for figure errors in the base multilayer stack or the substrate on which the multilayer stack is provided. A reflective mask for EUV uses two multilayer stacks, one introducing a relative phase shift and/or altered reflectivity with respect to the other one.

35 Claims, 3 Drawing Sheets

Total thickness (nm)

LITHOGRAPHIC APPARATUS, DEVICE MANUFACTURING METHODS, DEVICES MANUFACTURED THEREBY, METHOD OF MANUFACTURING A REFLECTOR, REFLECTOR MANUFACTURED THEREBY AND PHASE SHIFT MASK

This application is a continuation of U.S. patent application Ser. No. 10/147,309, filed May 17, 2002 now U.S. Pat. No. 6,777,140, which also claims priority from European Patent Application EP 01304452.4, filed May 21, 2001, both of which are herein incorporated by reference.

FIELD

The invention relates generally to lithographic apparatus and more particularly to reflectors.

BACKGROUND

In general, a lithographic projection apparatus comprises: a radiation system to supply a projection beam of radiation, a support structure to support patterning structure, the patterning structure serving to pattern the projection beam according to a desired pattern, a substrate table to hold a substrate, and a projection system to project the patterned beam onto a target portion of the substrate.

The term "patterning structure" as here employed should be broadly interpreted as referring to structure or means that can be used to endow an incoming radiation beam with a patterned cross-section, corresponding to a pattern that is to be created in a target portion of the substrate; the term "light valve" can also be used in this context. Generally, the said pattern will correspond to a particular functional layer in a device being created in the target portion, such as an integrated circuit or other device (see below). Examples of such patterning structure include:

A mask. The concept of a mask is well known in lithography, and it includes mask types such as binary, alternating phase-shift, and attenuated phase-shift, as well as various hybrid mask types. Placement of such a mask in the radiation beam causes selective transmission (in the case of a transmissive mask) or reflection (in the case of a reflective mask) of the radiation impinging on the mask, according to the pattern on the mask. In the case of a mask, the support structure will generally be a mask table, which ensures that the mask can be held at a desired position in the incoming radiation beam, and that it can be moved relative to the beam if so desired.

A programmable mirror array. An example of such a device is a matrix-addressable surface having a viscoelastic control layer and a reflective surface. The basic principle behind such an apparatus is that (for example) addressed areas of the reflective surface reflect incident light as diffracted light, whereas unaddressed areas reflect incident light as undiffracted light. Using an appropriate filter, the said undiffracted light can be filtered out of the reflected beam, leaving only the diffracted light behind; in this manner, the beam becomes patterned according to the addressing pattern of the matrix-addressable surface. The required matrix addressing can be performed using suitable electronic means. More information on such mirror arrays can be gleaned, for example, from U.S. Pat. Nos. 5,296,891 and 5,523,193, which are incorporated herein by reference. In the case of a programmable mirror array, the said support structure may be embodied as a frame or table, for example, which may be fixed or movable as required.

A programmable LCD array. An example of such a construction is given in U.S. Pat. No. 5,229,872, which is incorporated herein by reference. As above, the support structure in this case may be embodied as a frame or table, for example, which may be fixed or movable as required.

For purposes of simplicity, the rest of this text may, at certain locations, specifically direct itself to examples involving a mask and mask table; however, the general principles discussed in such instances should be seen in the broader context of the patterning structure as hereabove set forth.

Lithographic projection apparatus can be used, for example, in the manufacture of integrated circuits (ICs). In such a case, the patterning structure may generate a circuit pattern corresponding to an individual layer of the IC, and this pattern can be imaged onto a target portion (e.g. comprising one or more dies) on a substrate (silicon wafer) that has been coated with a layer of radiation-sensitive material (resist). In general, a single wafer will contain a whole network of adjacent target portions that are successively irradiated via the projection system, one at a time. In current apparatus, employing patterning by a mask on a mask table, a distinction can be made between two different types of machine. In one type of lithographic projection apparatus, each target portion is irradiated by exposing the entire mask pattern onto the target portion at one time; such an apparatus is commonly referred to as a wafer stepper. In an alternative apparatus—commonly referred to as a step-and-scan apparatus—each target portion is irradiated by progressively scanning the mask pattern under the projection beam in a given reference direction (the "scanning" direction) while synchronously scanning the substrate table parallel or anti-parallel to this direction; since, in general, the projection system will have a magnification factor M (generally<1), the speed V at which the substrate table is scanned will be a factor M times that at which the mask table is scanned. More information with regard to lithographic devices as here described can be gleaned, for example, from U.S. Pat. No. 6,046,792, incorporated herein by reference.

In a manufacturing process using a lithographic projection apparatus, a pattern (e.g. in a mask) is imaged onto a substrate that is at least partially covered by a layer of radiation-sensitive material (resist). Prior to this imaging step, the substrate may undergo various procedures, such as priming, resist coating and a soft bake. After exposure, the substrate may be subjected to other procedures, such as a post-exposure bake (PEB), development, a hard bake and measurement/inspection of the imaged features. This array of procedures is used as a basis to pattern an individual layer of a device, e.g. an IC. Such a patterned layer may then undergo various processes such as etching, ion-implantation (doping), metallization, oxidation, chemo-mechanical polishing, etc., all intended to finish off an individual layer. If several layers are required, then the whole procedure, or a variant thereof, will have to be repeated for each new layer. Eventually, an array of devices will be present on the substrate (wafer). These devices are then separated from one another by a technique such as dicing or sawing, whence the individual devices can be mounted on a carrier, connected to pins, etc. Further information regarding such processes can be obtained, for example, from the book "Microchip Fabrication: A Practical Guide to Semiconductor Processing", Third Edition, by Peter van Zant, McGraw Hill Publishing Co., 1997, ISBN 0-07-067250-4, incorporated herein by reference.

For the sake of simplicity, the projection system may hereinafter be referred to as the "lens"; however, this term should be broadly interpreted as encompassing various types of projection system, including refractive optics, reflective optics, and catadioptric systems, for example. The radiation system may also include components operating according to any of these design types for directing, shaping or controlling the projection beam of radiation, and such components may also be referred to below, collectively or singularly, as a "lens". Further, the lithographic apparatus may be of a type having two or more substrate tables (and/or two or more mask tables). In such "multiple stage" devices the additional tables may be used in parallel, or preparatory steps may be carried out on one or more tables while one or more other tables are being used for exposures. Twin stage lithographic apparatus are described, for example, in U.S. Pat. No. 5,969,441 and PCT Patent Application WO 98/40791, incorporated herein by reference.

In order to meet the continual demand of manufacturers of semiconductor devices to be able to produce ever smaller features, it has been proposed to use Extreme Ultraviolet (EUV) radiation, e.g. with a wavelength of 5 to 20 nm, as the exposure radiation in a lithographic projection apparatus. Not least among the problems in designing such an apparatus is the creation of "optical" systems to illuminate evenly the patterning structure and to project the image of the pattern defined by the patterning structure accurately onto the substrate. Part of the difficulties in producing the necessary illumination and optical systems lies in the fact that no material suitable for making refractive optical elements at EUV wavelengths is presently known. Thus, the illumination and projection systems must be constructed out of mirrors which, at EUV wavelengths, have their own problems—specifically relatively low reflectivities and extremely high sensitivity to figure errors.

It is essential in a lithographic projection apparatus that the mirrors have high reflectivities since the illumination and projection systems may have a total of eight mirrors so that, with the additional reflection at the mask, the overall transmissivity of the systems is proportional to the ninth power of the reflectivity of the mirrors. To provide mirrors of sufficiently high reflectivity, it has been proposed to use mirrors formed by multilayer stacks of materials such as Mo, Si, Rh, Ru, Rb, Cl, Sr and Be. Further details of such multilayer stacks are given in European Patent Applications EP-A-1 065 532 and EP-A-1 065 568, which documents are hereby incorporated herein by reference.

Projection systems using mirrors are particularly sensitive to figure errors at EUV wavelengths because a figure error of only 3 nm would give rise to an error in the wavefront of about $\pi$ radians, leading to destructive interference and making the reflector totally useless for imaging. Figure errors may have a variety of causes: errors in the surface of the substrate on which the multilayers are deposited, defects in the multilayers, stresses in the multilayers resulting from the manufacturing process, etc. To correct such phase errors, it is proposed in PCT Patent Application WO97/33203 to add selectively a relatively thick additional layer of crystalline or amorphous Si to the front surface of a reflector formed by a multilayer stack of Mo/Si. However, an additional layer locally reduces the reflectivity of the mirror, which may cause non-uniform illumination or exposure in lithographic projection apparatus. European Patent Application EP-0 708 367-A discloses the use of a relatively thick layer having attenuation and phase shifting functions locally deposited on a multilayer stack to form a mask pattern.

SUMMARY

In an aspect of at least one embodiment of the present invention, there is provided improved reflectors useable with EUV radiation that have reduced figure errors and adequate reflectivity.

According to at least one embodiment of the invention, there is provided a lithographic apparatus comprising a radiation system to supply a projection beam of radiation, a support structure to support patterning structure, the patterning structure serving to pattern the projection beam according to a desired pattern, a substrate table to hold a substrate, and a projection system to project the patterned beam onto a target portion of the substrate wherein at least one of the radiation system, the projection system and the patterning structure comprises a reflector provided with a multilayer stack comprising a plurality of base periods and at least one additional period covering only part of an effective area of said reflector to effect a local change in phase and/or reflectivity relative to an adjacent area of said reflector upon reflection of said projection beam.

According to at least one embodiment of the invention there is provided a device manufacturing method comprising:

providing a substrate that is at least partially covered by a layer of radiation-sensitive material;

providing a projection beam of radiation using a radiation system;

using patterning structure to endow the projection beam with a pattern in its cross-section; and projecting the patterned beam of radiation onto a target portion of the layer of radiation-sensitive material, wherein said projection beam or said patterned beam is directed or patterned using a reflector provided with a multilayer stack comprising a plurality of base periods and at least one additional period covering only part of the effective area of said reflector to effect a local change in phase and/or reflectivity relative to an adjacent area of said reflector.

Further, according to at least one embodiment of the invention, there is provided a method of manufacturing a reflector for use in the radiation or illumination systems of a lithographic projection apparatus the method comprising:

providing a multilayer stack on a substrate;

determining any figure errors in the multilayer stack or substrate; and selectively providing at least one additional period on the front surface of said multilayer stack to effect a local change in phase and/or reflectivity relative to adjacent areas of said reflection in radiation reflected by said reflector to compensate for the effects of said figure errors.

Still further, according to at least one embodiment of the invention, there is provided a phase shift mask for use in lithographic projection, said mask comprising a multilayer stack comprising a plurality of base periods and a phase-shifting multilayer stack comprising at least one phase-shifting period covering only part of the effective area of said mask to effect a local phase shift, different than a phase change on reflection from said base periods.

Still further, according to at least one embodiment of the invention, there is provided a device manufacturing method comprising:

providing a substrate that is at least partially covered by a layer of radiation-sensitive material;

providing a projection beam of radiation using a radiation system;

using patterning structure to endow the projection beam with a pattern in its cross-section; and projecting the patterned beam of radiation onto a target portion of the layer of radiation-sensitive material, wherein said using patterning structure comprises using a phase shift mask, said mask comprising a multilayer stack comprising a plurality of base periods and an additional multilayer stack comprising at least one additional period covering only part of the effective area of said mask, whereby said additional period effects a local change in phase and/or reflectivity relative to adjacent areas of said mask on reflection of a projection beam.

Although specific reference may be made in this text to the use of the apparatus according to at least one embodiment of the present invention in the manufacture of ICs, it should be explicitly understood that such an apparatus has many other possible applications. For example, it may be employed in the manufacture of integrated optical systems, guidance and detection patterns for magnetic domain memories, liquid-crystal display panels, thin-film magnetic heads, etc. The skilled artisan will appreciate that, in the context of such alternative applications, any use of the terms "reticle", "wafer" or "die" in this text should be considered as being replaced by the more general terms "mask", "substrate" and "target portion", respectively.

In the present document, the terms "radiation" and "beam" are used to encompass all types of electromagnetic radiation, including ultraviolet radiation (e.g. with a wavelength of 365, 248, 193, 157 or 126 nm) and EUV (extreme ultra-violet radiation, e.g. having a wavelength in the range 5–20 nm).

BRIEF DESCRIPTION OF THE DRAWINGS

Embodiments of the invention will now be described, by way of example only, with reference to the accompanying schematic drawings in which corresponding reference symbols indicate corresponding parts and in which.

DETAILED DESCRIPTION

Figure 1:
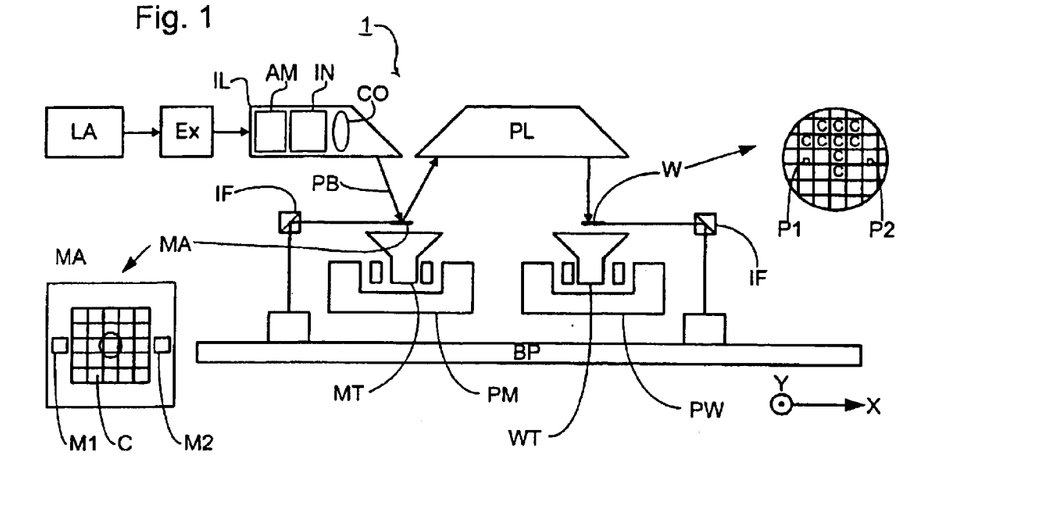
FIG. 1 depicts a lithographic projection apparatus according to at least one embodiment of the invention.

FIG. 1 schematically depicts a lithographic projection apparatus according to at least one embodiment of the invention. The apparatus comprises:

a radiation system Ex, IL, for supplying a projection beam PB of radiation (e.g. EUV radiation). In this particular case, the radiation system also comprises a radiation source LA;

a first object table (mask table) MT provided with a mask holder for holding a mask MA (e.g. a reticle), and connected to first positioning means for accurately positioning the mask with respect to item PL;

a second object table (substrate table) WT provided with a substrate holder for holding a substrate W (e.g. a resist-coated silicon wafer), and connected to second positioning means for accurately positioning the substrate with respect to item PL;

a projection system ("lens") PL (e.g. a mirror group) for imaging an irradiated portion of the mask MA onto a target portion C (e.g. comprising one or more dies) of the substrate W. As here depicted, the apparatus is of a reflective type (i.e. has a reflective mask). However, in general, it may also be of a transmissive type, for example (with a transmissive mask). Alternatively, the apparatus may employ another kind of patterning structure, such as a programmable mirror array of a type as referred to above. M1, M2, P1 and P2 are alignment marks for respectively aligning the mask and the wafer.

The source LA (e.g. a laser-produced or discharge plasma source) produces a beam of radiation. This beam is fed into an illumination system (illuminator) IL, either directly or after having traversed conditioning means, such as a beam expander Ex, for example. The illuminator IL may comprise adjusting means AM for setting the outer and/or inner radial extent (commonly referred to as σ-outer and σ-inner, respectively) of the intensity distribution in the beam. In addition, it will generally comprise various other components, such as an integrator IN and a condenser CO. In this way, the beam PB impinging on the mask MA has a desired intensity distribution in its cross-section.

It should be noted with regard to FIG. 1 that the source LA may be within the housing of the lithographic projection apparatus (as is often the case when the source LA is a mercury lamp, for example), but that it may also be remote from the lithographic projection apparatus, the radiation beam which it produces being led into the apparatus (e.g. with the aid of suitable directing mirrors); this latter scenario is often the case when the source LA is an excimer laser. The present invention encompass at least both of these scenarios.

The beam PB subsequently intercepts the mask MA, which is held on a mask table MT. Having been selectively reflected by the mask MA, the beam PB passes through the lens PL, which focuses the beam PB onto a target portion C of the substrate W. With the aid of the second positioning means (and interferometric measuring means IF), the substrate table WT can be moved accurately, e.g. so as to position different target portions C in the path of the beam PB. Similarly, the first positioning means can be used to accurately position the mask MA with respect to the path of the beam PB, e.g. after mechanical retrieval of the mask MA from a mask library, or during a scan. In general, movement of the object tables MT, WT will be realized with the aid of a long-stroke module (coarse positioning) and a short-stroke module (fine positioning), which are not explicitly depicted in FIG. 1. However, in the case of a wafer stepper (as opposed to a step-and-scan apparatus) the mask table MT may just be connected to a short stroke actuator, or may be fixed.

The depicted apparatus can be used in two different modes:

1. In step mode, the mask table MT is kept essentially stationary, and an entire mask image is projected at one time (i.e. a single "flash") onto a target portion C. The substrate table WT is then shifted in the x and/or y directions so that a different target portion C can be irradiated by the beam PB;

2. In scan mode, essentially the same scenario applies, except that a given target portion C is not exposed in a single "flash". Instead, the mask table MT is movable in a given direction (the so-called "scan direction", e.g. the y direction) with a speed v, so that the projection beam PB is caused to scan over a mask image; concurrently, the substrate table WT is simultaneously moved in the same or opposite direction at a speed V=Mv, in which M is the magnification of the lens PL (typically, M=¼ or ⅕). In this manner, a relatively large target portion C can be exposed, without having to compromise on resolution.

By providing additional periods on top of the existing multilayer, desired phase and/or reflectivity corrections, e.g. to compensate for the effects of figure errors in the multilayer or underlying substrate, can be effected with a smaller effect on reflectivity. According to at least one embodiment of the invention, it is possible to correct both "valley-like" (a local depression in the multilayer, e.g. caused by a depression in the substrate) and "hill-like" (a local projection in the multilayer) figure errors. The additional periods are provided in a pattern that is the negative of the figure errors, i.e. additional periods are provided in the valley of a valley-like figure error and additional periods are substantially provided around but not over the hill-like figure error.

The additional periods may be made of the same materials as the underlying multilayer stack, e.g. Mo/Si, or different materials, e.g. Mo/Y, Ru/Si or Ru—Mo/Si on an Mo/Si stack. In at least one embodiment, the thicknesses of said additional layers are optimized to provide an appropriate trade-off between phase shift to extreme ultraviolet radiation as compared to a vacuum layer of thickness equal to the total thickness of said additional layers, and total reflectivity.

Each of the additional periods has a total thickness such that the path length of the radiation through it (in one direction) is about half a wavelength. In other words the total thickness is somewhat less than half a wavelength dependent on the angle of incidence of the radiation to be reflected. For maximum reflectivity the path length should be exactly half a wavelength but may be varied from this to affect a desired reflectivity change. For EUV radiation of wavelength of about 5 to 20 nm, the additional periods will each have a thickness less than about 10 nm, compared to thicknesses of several hundreds of nm.

Figure 2:
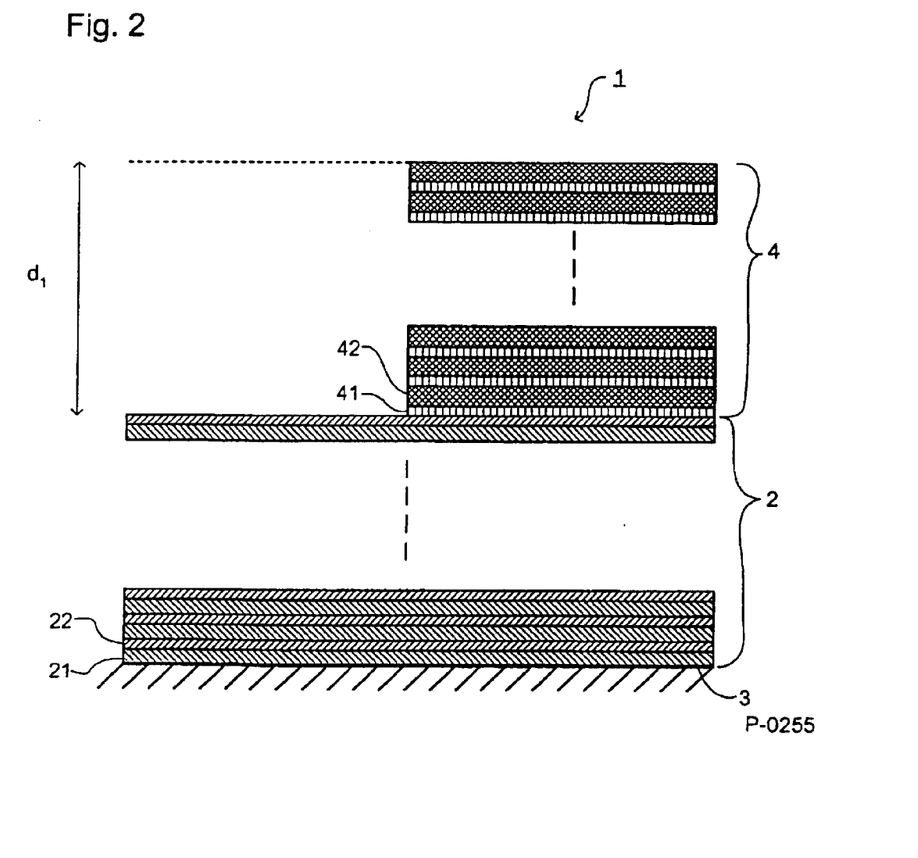
FIG. 2 illustrates a reflector used in at least one embodiment of the invention.

FIG. 2 shows a reflector 1 used in at least one embodiment of the invention. The reflector 1 comprises a multilayer stack 2, e.g. comprising alternating layers of Molybdenum 21 and Silicon 22, grown on a substrate 3. To correct figure errors in the multilayer reflector, e.g. deriving from figure errors in the substrate 3 or from defects in the manufacture of the multilayer stack 2, additional multilayers 4 are added locally, as necessary to provide the desired correction. The additional multilayers 4 may be made of alternating layers 41, 42 of the same materials as the multilayer stack 2, e.g. Molybdenum and Silicon, but have their thicknesses, optimized for the desired phase change. Mathematical techniques for optimization of the various layer thicknesses as described in European Patent Applications EP-A-1 065 532 and EP-A-1 065 568 may be used. To determine the figure errors that are to be corrected, interferometric techniques can be used.

Figure 3:
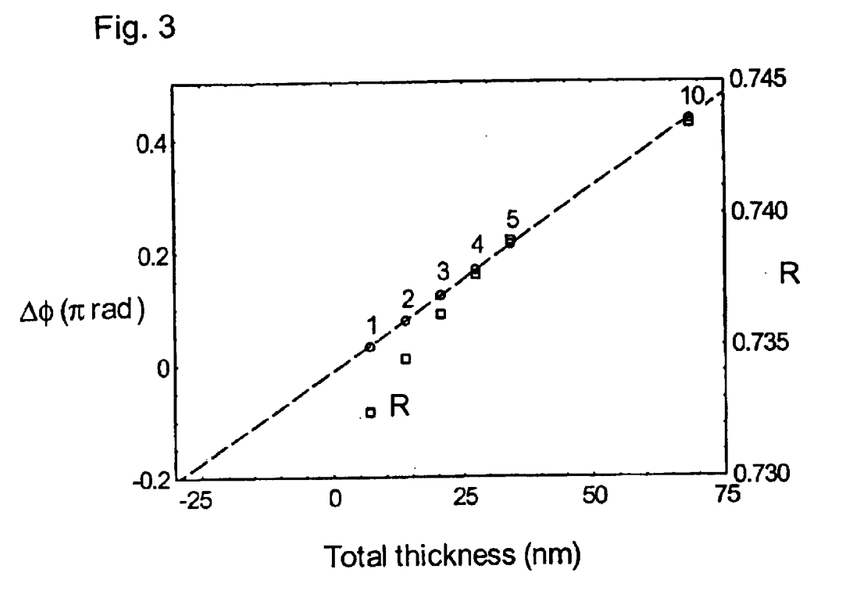
FIG. 3 is a graph of phase shift and reflectivity vs. total thickness for additional Mo/Si layers.

FIG. 3 shows the phase change Δφ (open circles), in units of π radians, achievable for the addition of 1, 2, 3, 4, 5 or 10 periods of Mo/Si as well as resulting increases in reflectivity (open squares). The dashed line is a least squares fit to the phase change values. In the following description the notation x-y/z (with x optional) is used to describe a period of a multilayer stack where y, and optionally x, may be denoted as an absorbing material and z as a spacer material. In addition, for a multilayer with additional periods, the base period is enclosed in { } and the additional layers in ( ). In general, a multilayer is "tuned" if the total optical thickness (physical thickness multiplied by refractive index) of its period is equal to half the wavelength of the incident radiation, taking into account the angle of incidence as necessary.

Figure 4:
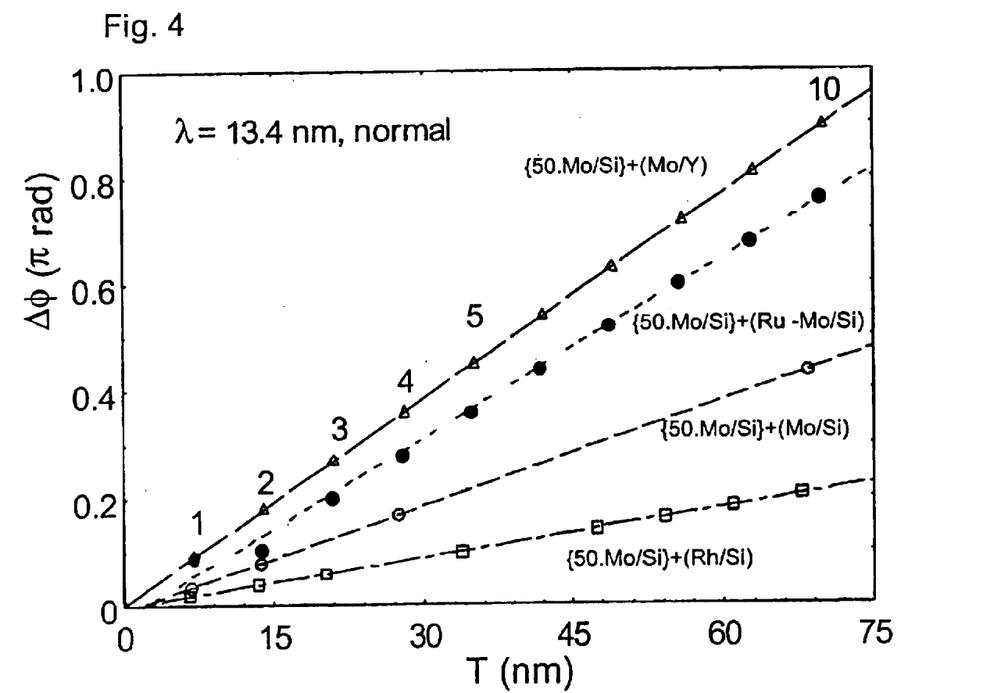
FIG. 4 is a graph of phase shift vs. total thickness for additional layers of various different combinations of materials.

As alternatives to the optimized Mo/Si layers, Ru can be used in place of or in addition to Mo and Y can be used in place of Si. FIG. 4 shows the phase shift Δφ, in units of π radians, achievable for the addition of 1 to 10 periods of Mo/Y (open triangles), Ru—Mo/Si (filled circles) and Rh/Si (open squares) to a fifty period Mo/Si multilayer. The results of FIG. 3 for the addition of optimized Mo/Si layers (open circles) are also shown for comparison. FIG. 4 shows that the use of Ru—Mo in place of Mo and Y in place of Si can provide greater phase changes (sensitivities) for the same physical thickness of additional layers. In the Ru—Mo/Si additional layers, the Ru and Mo layer thicknesses were fixed at 2 nm but may of course be optimized as desired.

In calculating the number and/or materials of the additional layers, account must be taken of the consequence of the complex refractive index of materials in the EUV region that the phase change on reflection, e.g. at the interface between Mo or Ru and Si layers, deviates from π radians which is expected for the non-absorbing case. For an Mo/Si stack the deviation is about 0.027π radians per period so that a ten-period optimized Mo/Si stack exhibits a 0.437π phase shift, as compared to a 0.62π phase shift that would be expected were there no absorption. It will be seen that the data in FIGS. 3 and 4 take this effect into account. Further, the values of phase changes of the additional multilayers are given with respect to a hypothetical "vacuum layer" of the same thickness as the added multilayers. The designs presented in FIGS. 3 and 4 include a final capping layer, whereas the designs of Table 1 do not, giving rise to a slight difference in presented values for comparable designs.

Table 1 below gives calculated phase sensitivities for various multilayer structures useable as additional layers according to at least one embodiment of the invention. It will be seen by comparing designs 1 and 2 that the phase sensitivity per period Δε increases from 0.043π to 0.054π as the Mo thickness is deliberately set to 4.0 nm. Similarly, Ru/Si designs 3 and 4 exhibit a large change in Δε as the Ru thickness is increased form 1.98 nm to 3.50 nm (changing the partition ration, i.e. the ratio of the thickness of the absorber and the spacer layers in the multilayer period). This is because of the lower n of Ru compared to Mo but the higher extinction coefficient of Ru means that there is a significant drop in peak reflectivity. The three-component Ru—Mo/Si additional layers maintain high peak reflectivities even as the Ru and Mo thicknesses are increased, with designs 6 and 7 exhibiting particularly high values of Δε. The yttrium-based stacks exhibit the greatest phase sensitivity due to the significant contribution of Y to the phase change with respect to vacuum.

It will also be seen that only small phase sensitivities are exhibited by the Rh/Si, Pd/Si and Pt/Si designs. This means that even a large physical thickness of such additional layers may be deposited yielding a negligible wavefront phase change (with respect to a hypothetical vacuum layer of the same thickness) and such layers may be optionally used as filler layers between the localized additional layers so that the reflector surface is substantially uniform. Note that in designs 13 and 14, the total (optical) thickness of the multilayer structure has been detuned to shift the peak reflectivity to 13.5 nm (though the peak reflectivity quoted is at 13.4 nm) to increase the phase change sensitivity by changing the spacer thickness (Y or Si) with respect to designs 12 and 7, respectively.

Any figure error may be corrected by adding additional multilayers at those locations that exhibit a "valley"-like figure error. Another approach is to add the additional multilayers over the whole of the reflective surface and mill away some or all of the added multilayers, as required, at those locations that exhibit a "hill"-like figure error. Filler stacks presenting a small or negligible phase change (as will be described below) may be added in between the additional multilayers presenting a large phase change to and up with an approximately level reflective surface.

TABLE 1

Phase sensitivity and effective peak reflectivity of various multilayer period structures grown on an optimized 50-period Mo/Si (2.77 nm Mo and 4.08 nm Si) base multilayer tuned for $\lambda = 13.4$ nm operation at normal incidence with a peak reflectivity of 0.748.

| ML period of the form x-y/z | Layer thickness (nm) | | | Peak Reflectivity | | $\Delta\epsilon$ ($\pi$ radians) |
|---|---|---|---|---|---|---|
| | x | y | z | 5 periods | 10 periods | |
| 1 Mo/Si | — | 2.68 | 4.17 | 0.749 | 0.749 | 0.043 |
| 2 Mo/Si | — | 4.00 | 2.90 | 0.725 | 0.716 | 0.054 |
| 3 Ru/Si | — | 1.98 | 4.82 | 0.727 | 0.716 | 0.028 |
| 4 Ru/Si | — | 3.50 | 3.40 | 0.678 | 0.658 | 0.080 |
| 5 Ru-Mo/Si | 1.00 | 1.68 | 4.18 | 0.752 | 0.754 | 0.045 |
| 6 Ru-Mo/Si | 1.80 | 1.80 | 3.30 | 0.737 | 0.734 | 0.073 |
| 7 Ru-Mo/Si | 2.00 | 2.00 | 2.93 | 0.723 | 0.715 | 0.090 |
| 8 Rh/Si | — | 1.51 | 5.25 | 0.704 | 0.679 | 0.015 |
| 9 Pd/Si | — | 1.15 | 5.59 | 0.688 | 0.648 | 0.008 |
| 10 Pt/Si | — | 0.87 | 5.85 | 0.678 | 0.625 | 0.003 |
| 11 Mo/Y | — | 2.61 | 4.37 | 0.695 | 0.664 | 0.090 |
| 12 Ru-Mo/Y | 2.00 | 2.00 | 3.06 | 0.685 | 0.639 | 1.109 |
| 13 Ru-Mo/Y | 2.00 | 2.00 | 3.15 | 0.670 | 0.626 | 0.121 |
| 14 Ru-Mo/Si | 2.00 | 2.00 | 3.10 | 0.658 | 0.608 | 0.111 |

According to at least one embodiment of the present invention, there is provided a phase shift mask for use at EUV wavelengths. The phase shift mask can be used in a lithographic apparatus as described with reference to FIG. 1, with or without the corrected reflectors described above.

Figure 5:
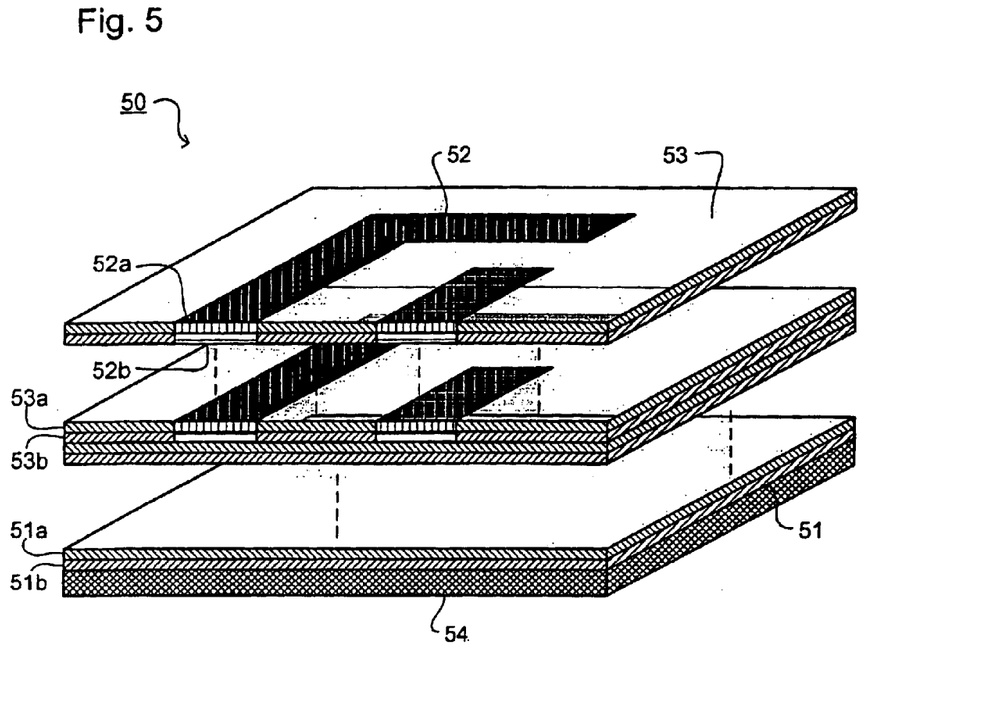
FIG. 5 illustrates a phase shift mask according to at least one embodiment of the invention.

A phase shift reflective mask 50 is shown in FIG. 5 of the accompanying drawings. This comprises a base multilayer stack 51 each period of which comprises a layer of absorbing material 51a and a layer of a spacer material 51b. On top of the base multilayer 51 are selectively provided a phase shifting stack 52, again each period of which comprises a layer of absorbing material 52a and a layer of a spacer material 52b, and a filler stack 53, each period of which also comprises a layer of absorbing material 53a and a layer of a spacer material 53b. The phase shifting stack 52 and filler stack 53 are arranged in a pattern as necessary to pattern the projection beam to cause the desired image to be projected onto the substrate. Design rules for the phase shift mask of the present invention can be adapted as necessary from those employed for phase shift masks at other frequencies.

Figure 6:
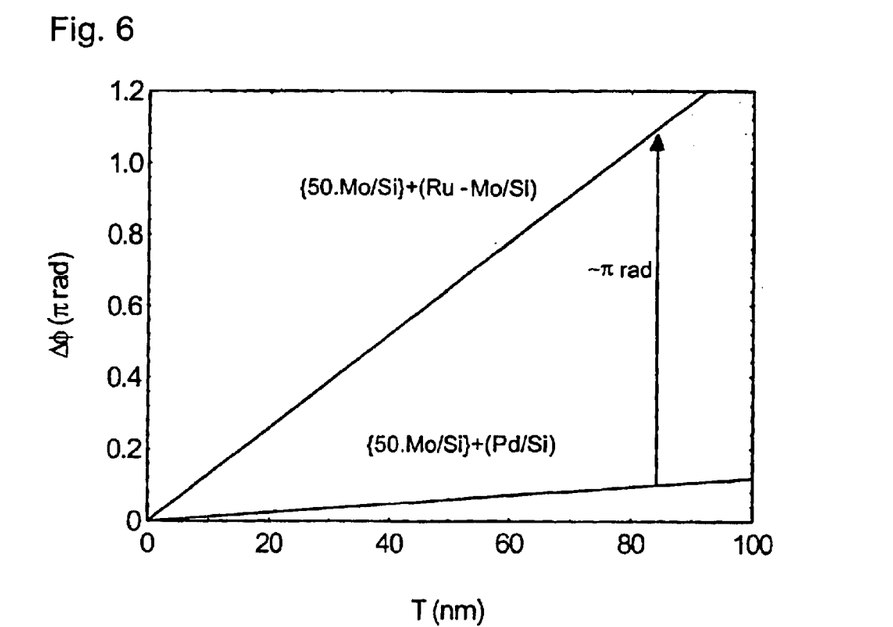
FIG. 6 is a graph of phase shift vs. total thickness for two multilayer stacks used in the phase shift mask of at least one embodiment.

The phase shift mask, according to at least one embodiment of the present invention, exploits the ability described above to provide multilayer stacks with both large phase sensitivities and small phase sensitivities. A phase shift mask necessitates selectively shifting the optical wavefront by, for instance, n radians. A $\pi$ radian (or any other value such as $\pi/2$) phase change is readily achievable with respect to a "vacuum layer" or with respect to a filler multilayer (e.g. designs 9 and 10 in Table 1), albeit at the expense of some reflectivity. As shown in FIG. 6, a $\pi$ phase shift is shown between a phase shifting stack 52 of Ru—Mo/Si (design 7 in Table 1) and a filler stack of Pd/Si (design 9 in Table 1) after approximately 11 periods. An advantage of such a phase shift mask with a $\pi$-radian phase change with respect to a filler stack is that the surface of the mask may be level to within ~3 nm.

The additional period(s) according to at least one embodiment of the present invention can be used to effect local changes in reflectivity as well as or instead of phase, e.g. by choice of materials, partition ratio and/or period thickness. In a reflector, such changes in reflectivity may be used to compensate for reflectivity errors in the base layers or in another component. In a mask, such reflectivity changes can be used to create partially attenuating mask types.

While specific embodiments of the invention have been described above, it will be appreciated that the invention may be practiced otherwise than as described. The description is not intended to limit the invention. In particular, the calculations on which the present examples are based employed the optical constants set out in Table 2 below. To design reflectors and masks for use at other wavelengths, or should such constants be determined to be inaccurate, the skilled person can effect appropriate corrections.

TABLE 2

| | Optical constants ($\lambda = 13.4$ nm) | |
|---|---|---|
| Material | n | k |
| Mo | 0.9227 | 0.0062 |
| Pd | 0.8780 | 0.0443 |
| Pt | 0.8928 | 0.0577 |
| Rh | 0.8775 | 0.0296 |
| Ru | 0.8898 | 0.0165 |
| Si | 0.9999 | 0.0018 |
| Y | 0.9742 | 0.0023 |

Optical constants of the materials referred to above. The complex refractive indices (n - ik) are taken from: B. L. Henke, E. M. Gullikson, and J. C. Davis, "X-ray interactions: photoabsortion, scattering, transmission and reflection at E = 50–30,000 eV, Z = 1–92," At. Data Nucl. Data Tables 54, 181–342 (1993).

What is claimed is:

1. A lithographic apparatus comprising:
   an illumination system configured to provide a beam of radiation;
   a support structure configured to support a patterning structure, the patterning structure being configured to endow a beam of radiation with a pattern in its cross-section;
   a substrate table configured to hold a substrate; and
   a projection system configured to project the patterned beam onto a target portion of the substrate,
   wherein an optical path of the beam of radiation includes a reflector provided with (1) a reflecting multilayer stack having a plurality of base periods and (2) at least one additional period covering only part of a surface of the multilayer stack, and
   wherein said at least one additional period is configured to effect, in a reflected beam and relative to an adjacent portion of said surface, a local change of at least one of the group consisting of phase and intensity, and
   wherein at least one of said base periods comprises an absorber layer and a spacer layer.

2. The lithographic apparatus according to claim 1, wherein at least one of the group consisting of the illumination system, the projection system and the patterning structure comprises the reflector.

3. The lithographic apparatus according to claim 1, wherein a total thickness of an additional period is less than ten nanometers.

4. The lithographic apparatus according to claim 1, wherein a total thickness of each additional period is less than ten nanometers.

5. The lithographic apparatus according to claim 1, wherein the reflector includes a capping layer.

6. The lithographic apparatus according to claim 1, wherein the operative surface of the reflector is uniform to within one-half of a total thickness of one additional period.

7. A device manufacturing method comprising:
using patterning structure to endow a beam of radiation with a pattern in its cross-section; and
projecting the patterned beam onto a target portion of a layer of radiation-sensitive material that at least partially covers a substrate,
wherein an optical path of the beam during said projecting includes a reflector provided with (1) a multilayer stack having a plurality of base periods and (2) at least one additional period covering only part of a surface of the multilayer stack,
wherein said at least one additional period is configured to effect, in a reflected beam and relative to an adjacent portion of said surface, a local change of at least one of the group consisting of phase and intensity, and
wherein at least one of said base periods comprises an absorber layer and a spacer layer.

8. The device manufacturing method according to claim 7, said method comprising directing the beam at the reflector at an angle of incidence such that a path length of the beam through at least one additional period is substantially equal to one-half of a principal wavelength of the beam of radiation.

9. The device manufacturing method according to claim 7, said method comprising directing the beam at the reflector at an angle of incidence such that a product of the physical thickness of one additional period and an index of refraction of the additional period is substantially equal to one-half of a principal wavelength of the beam of radiation.

10. The device manufacturing method according to claim 7, wherein an additional period has a peak reflectivity at a wavelength different than a principal wavelength of said beam of radiation.

11. The device manufacturing method according to claim 7, wherein at least one of said using patterning structure and said projecting comprises directing the beam at the reflector at an angle of incidence such that a product of the physical thickness of one additional period and an index of refraction of the additional period is substantially equal to one-half of a principal wavelength of the beam of radiation.

12. The device manufacturing method according to claim 7, wherein said using patterning structure comprises using a phase shift mask that includes a reflector provided with (1) a multilayer stack having a plurality of base periods and (2) at least one additional period covering only part of a surface of the multilayer stack,
wherein said at least one additional period is configured to effect, relative to an adjacent portion of said surface, a local change of phase in the beam of radiation.

13. A method of manufacturing a reflector, the method comprising:
providing a multilayer stack on a substrate to form a reflector;
subsequent to said providing a multilayer stack, determining a figure error in the reflector; and
based on the determined figure error, modifying the reflector by providing at least one additional period on a selected portion of a surface of said multilayer stack,
wherein said at least one additional period is configured to effect, in a reflected beam and relative to an adjacent portion of said surface, a local change in at least one of the group consisting of phase and intensity, and
wherein said reflector comprises an absorber layer and a spacer layer.

14. The method of manufacturing a reflector according to claim 13, wherein the at least one additional period is configured to effect, in a reflected beam and relative to an adjacent portion of said surface, a local phase change of substantially $\pi$ radians at a wavelength in the range of from five to twenty nanometers.

15. The method of manufacturing a reflector according to claim 13, wherein said reflector has a reflectance peak at a wavelength in the range of from five to twenty nanometers.

16. The method of manufacturing a reflector according to claim 13, wherein at least one additional period has a different partition ratio than a period of said multilayer stack.

17. The method of manufacturing a reflector according to claim 13, wherein said determining a figure error includes using interferometric techniques to determine the figure error.

18. The method of manufacturing a reflector according to claim 13, wherein a total thickness of an additional period is less than ten nanometers.

19. The method of manufacturing a reflector according to claim 13, wherein a total thickness of each additional period is less than ten nanometers.

20. The method of manufacturing a reflector according to claim 13, wherein the reflector includes a capping layer.

21. The method of manufacturing a reflector according to claim 13, wherein, subsequent to said modifying, an operative surface of the reflector is uniform to within one-half of a total thickness of one additional period.

22. The method of manufacturing a reflector according to claim 13, said method comprising, subsequent to said modifying, providing at least one filler layer on a portion of a surface of said multilayer stack,
wherein said filler layer is configured to effect, in a reflected beam, a different change in at least one of the group consisting of phase and intensity than said at least one additional period.

23. The method of manufacturing a reflector according to claim 13, wherein said providing at least one additional period comprises at least one of the group consisting of growing and depositing the at least one additional period.

24. The method of manufacturing a reflector according to claim 13, wherein said providing at least one additional period comprises (1) covering substantially all of the surface of said multilayer stack with said at least one additional period and (2) selectively milling away said at least one additional period to uncover a portion of said surface of said multilayer stack.

25. The method of manufacturing a reflector according to claim 13, wherein at least one additional period comprises alternating layers of molybdenum and silicon, respectively.

26. The method of manufacturing a reflector according to claim 13, wherein at least one additional period is formed of the same materials as said multilayer stack.

27. The method of manufacturing a reflector according to claim 13, wherein at least one additional period is formed of different materials than said multilayer stack.

28. The method of manufacturing a reflector according to claim 13, wherein at least one additional period includes a first layer comprising at least one of the group consisting of molybdenum, rhodium, palladium, platinum, and ruthenium.

29. The method of manufacturing a reflector according to claim 13, wherein at least one additional period includes a second layer comprising at least one of the group consisting of silicon and yttrium.

30. The method of manufacturing a reflector according to claim 13, wherein at least one additional period includes three layers respectively comprising ruthenium, molybdenum, and silicon.

31. A phase shift mask for use in lithographic projection, said mask comprising:
- a reflecting multilayer stack having a plurality of base periods; and
- at least one additional period covering only part of a surface of the multilayer stack,
- wherein said at least one additional period is configured to effect, relative to an adjacent portion of said surface, a local change of phase in a reflected beam, and
- wherein at least one of said base periods comprises an absorber layer and a spacer layer.

32. The phase shift mask according to claim 31, wherein a total thickness of an additional period is less than ten nanometers.

33. The phase shift mask according to claim 31, wherein a total thickness of each additional period is less than ten nanometers.

34. The phase shift mask according to claim 31, wherein the mask includes a capping layer.

35. The phase shift mask according to claim 31, wherein the operative surface of the mask is uniform to within one-half of a total thickness of one additional period.

* * * * *